US011265028B2

(12) United States Patent
Uejima

(10) Patent No.: US 11,265,028 B2
(45) Date of Patent: Mar. 1, 2022

(54) RADIO FREQUENCY MODULE AND COMMUNICATION DEVICE

(71) Applicant: Murata Manufacturing Co., Ltd., Nagaokakyo (JP)

(72) Inventor: Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/114,497

(22) Filed: Dec. 8, 2020

(65) Prior Publication Data

US 2021/0153138 A1    May 20, 2021

Related U.S. Application Data

(63) Continuation of application No. PCT/JP2019/022988, filed on Jun. 10, 2019.

(30) Foreign Application Priority Data

Jun. 11, 2018 (JP) .............................. JP2018-111070

(51) Int. Cl.
*H04B 1/00* (2006.01)
*H04W 88/06* (2009.01)
(Continued)

(52) U.S. Cl.
CPC ........... *H04B 1/0475* (2013.01); *H04B 1/006* (2013.01); *H04B 1/04* (2013.01); *H04B 1/10* (2013.01);
(Continued)

(58) Field of Classification Search
CPC ........ H04B 1/0475; H04B 1/006; H04B 1/10; H04B 2001/0408; H04W 52/243;
(Continued)

(56) References Cited

U.S. PATENT DOCUMENTS

2015/0366099 A1   12/2015  Lee
2021/0099190 A1*   4/2021  Uejima .................... H04B 1/38
2021/0099191 A1*   4/2021  Uejima ................ H04B 1/0057

FOREIGN PATENT DOCUMENTS

JP    2012-70267 A    4/2012
JP    2014-522216 A   8/2014
(Continued)

OTHER PUBLICATIONS

International Search Report and Written Opinion dated Aug. 13, 2019, received for PCT Application No. PCT/JP2019/022988, Filed on Jun. 10, 2019, 7 pages including English Translation.
(Continued)

*Primary Examiner* — Lee Nguyen
(74) *Attorney, Agent, or Firm* — Xsensus LLP

(57) ABSTRACT

A radio frequency module includes a first transmission power amplifier configured to amplify a radio frequency signal of a first communication band, a second transmission power amplifier configured to amplify a radio frequency signal of a second communication band, and a module board which includes a first principal surface and a second principal surface on opposite sides of the module board, and on which the first transmission power amplifier and the second transmission power amplifier are mounted. The first transmission power amplifier is disposed on the first principal surface, and the second transmission power amplifier is disposed on the second principal surface.

10 Claims, 4 Drawing Sheets

(51) Int. Cl.
  *H04B 1/04*    (2006.01)
  *H04B 1/10*    (2006.01)
  *H04W 52/24*   (2009.01)
  *H04W 52/52*   (2009.01)
  *H04B 1/40*    (2015.01)

(52) U.S. Cl.
  CPC ............ *H04B 1/40* (2013.01); *H04W 52/243* (2013.01); *H04W 52/52* (2013.01); *H04W 88/06* (2013.01); *H04B 2001/0408* (2013.01); *H04B 2001/0416* (2013.01)

(58) Field of Classification Search
  CPC ...... H04W 52/52; H04W 88/06; H05K 7/026; H05K 7/06
  USPC ...................................................... 455/552.1
  See application file for complete search history.

(56) References Cited

FOREIGN PATENT DOCUMENTS

| | | |
|---|---|---|
| JP | 2015-162875 A | 9/2015 |
| KR | 10-2015-0142280 A | 12/2015 |
| WO | 2018/088410 A1 | 5/2018 |

OTHER PUBLICATIONS

English translation of the Written Opinion of the International Search Authority dated Aug. 13, 2019, corresponding PCT/JP2019/022988, 5 pages.
Office Action dated Jan. 6, 2022 in Korean Patent Application No. 10-2020-7034394, 8 pages.

\* cited by examiner

RADIO FREQUENCY MODULE AND COMMUNICATION DEVICE

CROSS REFERENCE TO RELATED APPLICATION

This is a continuation application of PCT International Application No. PCT/JP2019/022988 filed on Jun. 10, 2019, designating the United States of America, which is based on and claims priority of Japanese Patent Application No. 2018-111070 filed on Jun. 11, 2018. The entire disclosures of the above-identified applications, including the specifications, drawings and claims are incorporated herein by reference in their entirety.

TECHNICAL FIELD

The present disclosure relates to a radio frequency module and a communication device.

BACKGROUND

In mobile communication apparatuses such as a mobile phone the arrangement configuration of circuit elements included in radio frequency front-end circuits is becoming complex, particularly with developments in multiband technologies.

Patent Literature 1 discloses a circuit configuration of a transceiver (a transmission and reception circuit) that includes multiple transmitters (transmission paths), multiple receivers (reception paths), and a switchplexer disposed between an antenna and the transmitters and receivers, for performing carrier aggregation (CA) across multiple communication bands (frequency bands). Each of the transmitters has transmission circuits, a PA (a transmission power amplifier), and output circuits, while each of the receivers has reception circuits, an LNA (a reception low-noise amplifier), and input circuits. The output circuits include elements such as a transmission filter, an impedance matching circuit, and a duplexer, while the input circuits include elements such as a reception filter, an impedance matching circuit, and a duplexer. This configuration allows CA to be performed with switching operations of the switchplexer.

CITATION LIST

Patent Literature

PTL 1: Japanese Unexamined Patent Application Publication (Translation of PCT Application) No. 2014-522216

SUMMARY

Technical Problems

However, if the transceiver (the transmission and reception circuit) disclosed in Patent Literature 1 is implemented in a single module as a compact front-end circuit in a mobile communication device, two transmitters (transmission paths) propagating radio frequency transmission signals of different communication bands may be located in close proximity, and accordingly, the PAs of the two transmitters may be located in close proximity. When radio frequency transmission signals of different frequencies are simultaneously output from each of the two PAs, there are cases where the radio frequency transmission signal output from one PA leaks into the other PA. In this case, there is the problem that, in the other PA, intermodulation distortion is generated by the mixing of two radio frequency signals having mutually different frequencies, and the quality of the radio frequency signals output from the transmission and reception circuit deteriorates.

The present disclosure is conceived for solving the above problem and has as an object to provide a radio frequency module and a communication device that prevent deterioration of radio frequency transmission signal quality.

Solutions

In order to achieve the aforementioned object, a radio frequency module according to an aspect of the present disclosure includes: a first reception low-noise amplifier configured to amplify a radio frequency reception signal of a first communication band; a second reception low-noise amplifier configured to amplify a radio frequency reception signal of a second communication band different from the first communication band; and a module board which includes a first principal surface and a second principal surface on opposite sides of the module board, and on which the first reception low-noise amplifier and the second reception low-noise amplifier are mounted, wherein the first reception low-noise amplifier is disposed on the first principal surface, and the second reception low-noise amplifier is disposed on the second principal surface.

Advantageous Effects

The present disclosure can provide a radio frequency module and a communication device that prevent deterioration of radio frequency transmission signal quality.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
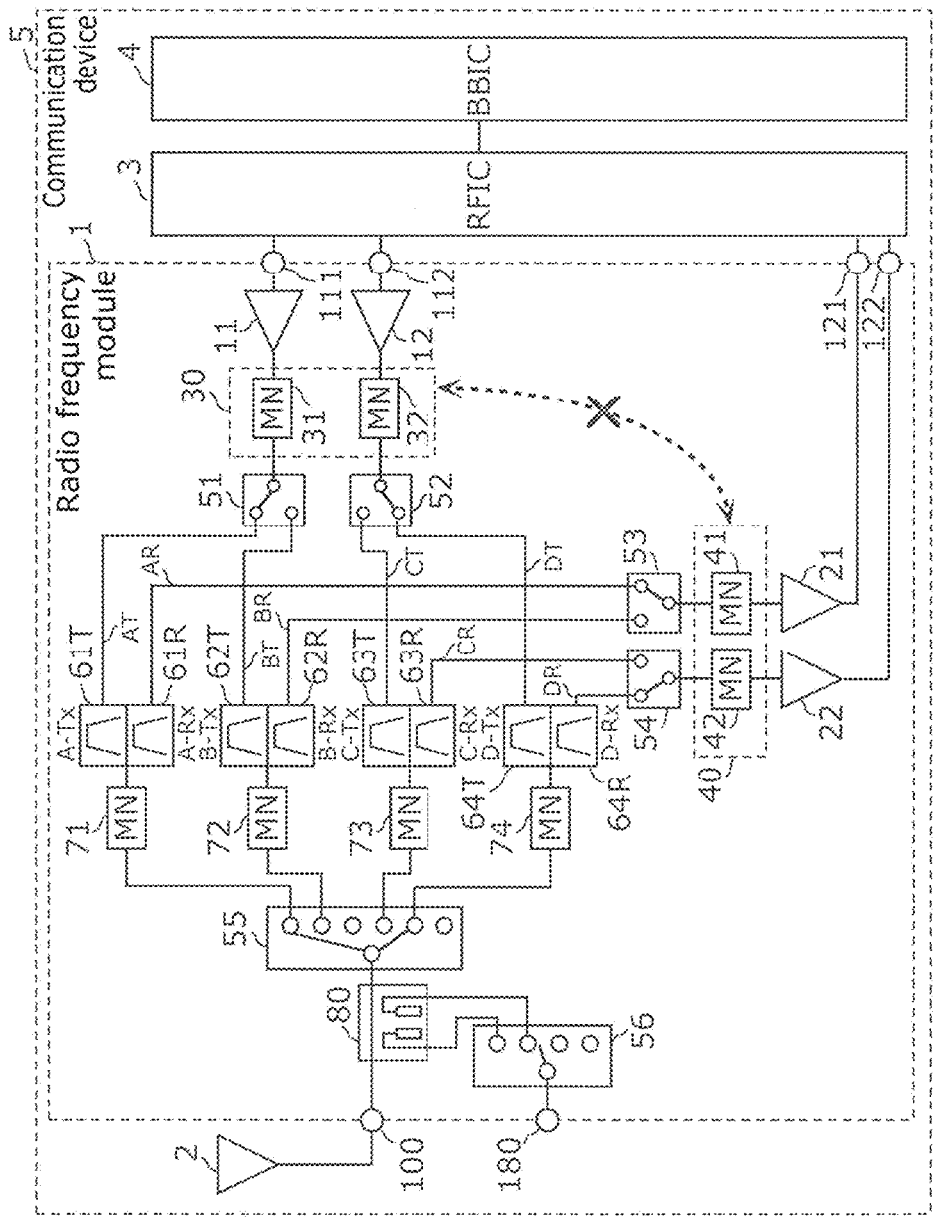
FIG. 1 is a circuit configuration diagram of a radio frequency module according to an embodiment.

Hereinafter, an exemplary embodiment and working examples of the present disclosure will be described in detail with reference to the drawings. It should be noted that each of the subsequently described exemplary embodiment and working examples shows a generic or a specific example. The numerical values, shapes, materials, elements, the arrangement and connection of the elements, and others indicated in the following exemplary embodiment and working examples are mere examples, and therefore are not intended to limit the present disclosure. Among the elements described in the following exemplary embodiment and working examples, elements not recited in any one of the independent claims are described as optional elements. In addition, the sizes of the elements and the ratio of the sizes illustrated in the drawings are not necessarily accurate.

It should be noted that, with regard to A, B, and C which are mounted on a board in the subsequent exemplary embodiment, "C is mounted between A and B in a plan view of the board (or a principal surface of the board)" means that, in a plan view of the board, at least part of the region of C projected on the plan view of the board overlaps a line connecting an any point in the region of A projected on the plan view of the board and any point in the region of B projected on the plan view of the board.

Embodiment

[1.1 Circuit Configuration of Radio Frequency Module 1 and Communication Device 5]

FIG. 1 is a circuit configuration diagram of radio frequency module 1 according to an embodiment. As illustrated in the figure, communication device 5 includes radio frequency module 1, antenna element 2, RF signal processing circuit (RFIC) 3, and baseband signal processing circuit (BBIC) 4.

RFIC 3 is an RF signal processing circuit that processes a radio frequency signal that is to be transmitted or has been received by antenna element 2, Specifically, RFIC 3 performs, by downconversion, and so on, signal processing on a radio frequency reception signal input via a reception signal path of radio frequency module 1, and outputs the reception signal generated by the signal processing to BBIC 4. Furthermore, RFIC 3 performs, by upconversion, and so on, signal processing on a transmission signal input from BBIC 4, and outputs a radio frequency transmission signal generated by the signal processing to a transmission signal path of radio frequency module 1.

BBIC 4 is a circuit that performs signal processing using an intermediate frequency band having a lower frequency than a radio frequency signal propagated in radio frequency module 1. The signal processed by BBIC 4 is, for example, used as an image signal for image display or as a sound signal for communication via a speaker.

Furthermore, RFIC 3 also functions as a controller that controls the connection of switches 51, 52, 53, 54, 55, and 56 included in radio frequency module 1, based on the communication band (frequency band) to be used. Specifically, RFIC 3 switches the connections of switches 51 to 56 included in radio frequency module 1 according to a control signal (not illustrated), It should be noted that the controller may be provided outside RFIC 3, and may be provided in radio frequency module 1 or BBIC 4, for example.

Antenna element 2 is connected to common terminal 100 of radio frequency module 1, emits radio frequency signals output from radio frequency module 1, and receives radio frequency signals from the outside and outputs the received radio frequency signals to radio frequency module 1.

It should be noted that in communication device 5 according to this embodiment, antenna element 2 and BBIC 4 are not essential elements.

Next, the detailed configuration of radio frequency module 1 will be described.

As illustrated in FIG. 1, radio frequency module 1 includes common terminal 100, transmission power amplifiers 11 and 12, reception low-noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, switches 51, 52, 53, 54, 55, and 56, coupler 80, coupler output terminal 180.

Common terminal 100 is connected to antenna element 2.

Transmission power amplifier 11 is a first transmission power amplifier that amplifies radio frequency signals of communication band A (a first communication band) and communication band B, both belonging to a first frequency band group. Transmission power amplifier 12 is a second transmission power amplifier that amplifies radio frequency signals of communication band C (a second communication band) and communication band D, both belonging to a second frequency band group covering frequencies higher than those of the first frequency band group.

Reception low-noise amplifier 21 is a first reception low-noise amplifier that amplifies, with low noise, radio frequency signals of communication band A (the first communication band) and communication band B. Reception low-noise amplifier 22 is a second reception low-noise amplifier that amplifies, with low noise, radio frequency signals of communication band C (the second communication band) and communication band D different from communication band A and communication band B.

Transmission filter 61T is a first transmission filter that is disposed in transmission path AT (a first transmission path) connecting transmission power amplifier 11 and common terminal 100, and that passes radio frequency transmission signals of the transmission band of communication band A out of radio frequency transmission signals amplified by transmission power amplifier 11, Transmission filter 62T is disposed in transmission path BT connecting transmission power amplifier 11 and common terminal 100, and passes radio frequency transmission signals of the transmission band of communication band B out of radio frequency transmission signals amplified by transmission power amplifier 11. Transmission filter 63T is a second transmission filter that is disposed in transmission path CT (a second transmission path) connecting transmission power amplifier 12 and common terminal 100, and that passes radio frequency transmission signals of the transmission band of communication band C out of radio frequency transmission signals amplified by transmission power amplifier 12. Transmission filter 64T is disposed in transmission path DT connecting transmission power amplifier 12 and common terminal 100, and passes radio frequency transmission signals of the transmission band of communication band D out of radio frequency transmission signals amplified by transmission power amplifier 12.

Reception filter 61R is a first reception filter disposed in reception path AR (a first reception path) including reception low-noise amplifier 21. More specifically, reception filter 61R is disposed in reception path AR connecting reception low-noise amplifier 21 and common terminal 100, and passes radio frequency reception signals of the reception band of communication band A out of radio frequency reception signals input from common terminal 100. Reception filter 62R is disposed in reception path BR connecting reception low-noise amplifier 21 and common terminal 100, and passes radio frequency reception signals of the reception band of communication band B out of radio frequency reception signals input from common terminal 100. Reception filter 63R is a second reception filter disposed in reception path CR (a second reception path) including reception low-noise amplifier 22. More specifically, reception filter 63R is disposed in reception path CR connecting reception low-noise amplifier 22 and common terminal 100, and passes radio frequency reception signals of the reception band of communication band C out of radio frequency reception signals input from common terminal 100. Reception filter 64R is disposed in reception path DR connecting reception low-noise amplifier 22 and common terminal 100, and passes radio frequency reception signals of the reception band of communication band D out of radio frequency reception signals input from common terminal 100.

It should be noted that above transmission filters 61T to 64T and reception filters 61R to 64R may be, but are not limited to, any of surface acoustic wave filters, acoustic wave filters that make use of bulk acoustic waves (BAWs), LC resonant filters, and dielectric filters, for example.

Transmission filter 61I and reception filter 61R constitute duplexer 61 which has, as a passband, communication band A. Furthermore, transmission filter 62T and reception filter 62R constitute duplexer 62 which has, as a passband, communication band B. In addition, transmission filter 63T and reception filter 63R constitute duplexer 63 which has, as a passband, communication band C. Moreover, transmission filter 64T and reception filter 64R constitute duplexer 64 which has, as a passband, communication band D.

Transmission output matching circuit 30 includes matching circuits 31 and 32. Matching circuit 31 is a first transmission output matching circuit connected to the output terminal of transmission power amplifier 11. More specifically, matching circuit 31 is disposed in a transmission path connecting transmission power amplifier 11 and transmission filters 61I and 62T, and matches the impedance of transmission power amplifier 11 and the impedance of transmission filters 61I and 62T. Matching circuit 32 is a second transmission output matching circuit connected to the output terminal of transmission power amplifier 12. More specifically, matching circuit 32 is disposed in a transmission path connecting transmission power amplifier 12 and transmission filters 63T and 64I, and matches the impedance of transmission power amplifier 12 and the impedance of transmission filters 63T and 64I.

Reception input matching circuit 40 includes matching circuits 41 and 42. Matching circuit 41 is a first reception input matching circuit connected to the input terminal of reception low-noise amplifier 21. More specifically, matching circuit 41 is disposed in a reception path connecting reception low-noise amplifier 21 and reception filters 61R and 62R, and matches the impedance of reception low-noise amplifier 21 and the impedance of reception filters 61R and 62R. Matching circuit 42 is a second reception input matching circuit connected to the input terminal of reception low-noise amplifier 22. More specifically, matching circuit 42 is disposed in a reception path connecting reception low-noise amplifier 22 and reception filters 63R and 64R, and matches the impedance of reception low-noise amplifier 22 and the impedance of reception filters 63R and 64R.

Switch 51 is a second switch disposed in a transmission path connecting matching circuit 31 and transmission filters 61T and 62T, and switches between connecting transmission power amplifier 11 and transmission filter 61T and connecting transmission power amplifier 11 and transmission filter 62T. For example, switch 51 is implemented as a single pole double throw (SPDT) switch circuit in which the common terminal is connected to matching circuit 31 while one selection terminal is connected to transmission filter 61T and the other selection terminal is connected to transmission filter 62T. Switch 52 is a second switch disposed in a transmission path connecting matching circuit 32 and transmission filters 63T and 64T, and switches between connecting transmission power amplifier 12 and transmission filter 63T and connecting transmission power amplifier 12 and transmission filter 64T. For example, switch 52 is implemented as an SPDT switch circuit in which the common terminal is connected to matching circuit 32 while one selection terminal is connected to transmission filter 63T and the other selection terminal is connected to transmission filter 64T. Switch 53 is a third switch disposed in a reception path connecting matching circuit 41 and reception filters 61R and 62R, and switches between connecting reception low-noise amplifier 21 and reception filter 61R and connecting reception low-noise amplifier 21 and reception filter 62R. For example, switch 53 is implemented as an SPDT switch circuit in which the common terminal is connected to matching circuit 41 while one selection terminal is connected to reception filter 61R and the other selection terminal is connected to reception filter 62R. Switch 54 is a third switch disposed in a reception path connecting matching circuit 42 and reception filters 63R and 64R, and switches between connecting reception low-noise amplifier 22 and reception filter 63R and connecting reception low-noise amplifier 22 and reception filter 64R. For example, switch 54 is implemented as an SPDT switch circuit in which the common terminal is connected to matching circuit 42 while one selection terminal is connected to reception filter 63R and the other selection terminal is connected to reception filter 64R.

Switch 55 is a first switch disposed in a signal path connecting common terminal 100 with transmission filters 61T to 64T and reception filters 61R to 64R, Switch 55 switches among (1) connecting common terminal 100 with transmission filter 61T and reception filter 61R, (2) connecting common terminal 100 with transmission filter 62T and reception filter 62R, (3) connecting common terminal 100 with transmission filter 63T and reception filter 63R, and (4) connecting common terminal 100 with transmission filter 64T and reception filter 64R, Switch 55 is implemented as a multi-connection switch circuit capable of simultaneously establishing two or more of the above connections (1) to (4).

Matching circuit 71 is disposed in a path connecting switch 55 with transmission filter 61T and reception filter 61R, and matches the impedance of antenna element 2 and switch 55 and the impedance of transmission filter 61T and reception filter 61R. Matching circuit 72 is disposed in a path connecting switch 55 with transmission filter 62T and reception filter 62R, and matches the impedance of antenna element 2 and switch 55 and the impedance of transmission filter 62T and reception filter 62R. Matching circuit 73 is disposed in a path connecting switch 55 with transmission filter 63T and reception filter 63R, and matches the impedance of antenna element 2 and switch 55 and the impedance of transmission filter 63T and reception filter 63R, Matching circuit 74 is disposed in a path connecting switch 55 with transmission filter 64T and reception filter 64R, and matches the impedance of antenna element 2 and switch 55 and the impedance of transmission filter 64T and reception filter 64R.

Coupler 80 and switch 56 form a circuit that monitors the power intensity of radio frequency signals transferred between common terminal 100 and switch 55, and output the monitored power intensity to, e.g., RFIC 3 via coupler output terminal 180.

It should be noted that matching circuits 71 to 74, coupler 80, switch 56, and coupler output terminal 180 are not essential elements of the radio frequency module according to the present disclosure.

In the configuration of radio frequency module 1 described above, transmission power amplifier 11, matching circuit 31, switch 51, and transmission filters 61T and 62T form a first transmission circuit that outputs radio frequency transmission signals of communication band A and communication band B toward common terminal 100. Transmission power amplifier 12, matching circuit 32, switch 52, and transmission filters 63T and 64T form a second transmission circuit that outputs radio frequency transmission signals of communication band C and communication band D toward common terminal 100, The first transmission circuit and the second transmission circuit form a transmission circuit that outputs radio frequency transmission signals of communication bands A to D toward common terminal 100.

Reception low-noise amplifier 21, matching circuit 41, switch 53, and reception filters 61R and 62R form a first reception circuit that receives input of radio frequency reception signals of communication band A and communication band B from antenna element 2 via common terminal 100. Reception low-noise amplifier 22, matching circuit 42, switch 54, and reception filters 63R and 64R form a second reception circuit that receives input of radio frequency reception signals of communication band C and communication band D from antenna element 2 via common terminal 100. The first reception circuit and the second reception circuit form a reception circuit that receives input of radio frequency reception signals of communication bands A to D from common terminal 100.

The above-described circuit configuration enables radio frequency module 1 according to this embodiment to perform at least one of simultaneously transmitting, simultaneously receiving, and simultaneously transmitting and receiving a radio frequency signal of either communication band A or communication band B and a radio frequency signal of either communication band C or communication band D.

It should be noted that, in the radio frequency module according to the present disclosure, the transmission circuit and the reception circuit may not be connected to common terminal 100 via switch 55; the transmission circuit and the reception circuit may be connected to antenna element 2 via a different terminal. It should also be noted that the circuit configuration of the radio frequency module according to the present disclosure may include at least transmission power amplifiers 11 and 12 and need not include reception low-noise amplifiers 21 and 22, transmission output matching circuit 30, reception input matching circuit 40, switches 51 to 56, transmission filters 61T to 64T, and reception filters 61R to 64R.

Here, if the circuit elements of above-described radio frequency module 1 are implemented in a single module as a compact front-end circuit, transmission path AT for communication band A and transmission path CT for communication band C, for example, may be located in close proximity. Accordingly, transmission power amplifier 11 connected to transmission path AT and transmission power amplifier 12 connected to transmission path CT may be located in close proximity. In this case, when radio frequency transmission signals of different frequencies are simultaneously output from each of transmission power amplifiers 11 and 12, there are cases where, for example, the radio frequency transmission signal output from transmission power amplifier 11 leaks into transmission power amplifier 12, In this case, there is the problem that, in transmission power amplifier 12, intermodulation distortion is generated by the mixing of two radio frequency signals having mutually different frequencies, and the quality of the radio frequency signals output from radio frequency module 1 deteriorates. Furthermore, in the same manner, there is the issue that, even in transmission power amplifier 11, intermodulation distortion is also generated by the mixing of two radio frequency signals having mutually different frequencies, and the quality of the radio frequency signals output from radio frequency module 1 deteriorates.

To address this, radio frequency module 1 according to this embodiment has a configuration that reduces mutual interference between transmission path AT and transmission path CT, and suppresses deterioration of radio frequency transmission signal quality. The following will describe the configuration that reduces such mutual interference and suppresses deterioration of radio frequency transmission in radio frequency module 1 according to this embodiment,

[1.2 Circuit Element Arrangement Configuration of Radio Frequency Module 1A]

Figure 2A:
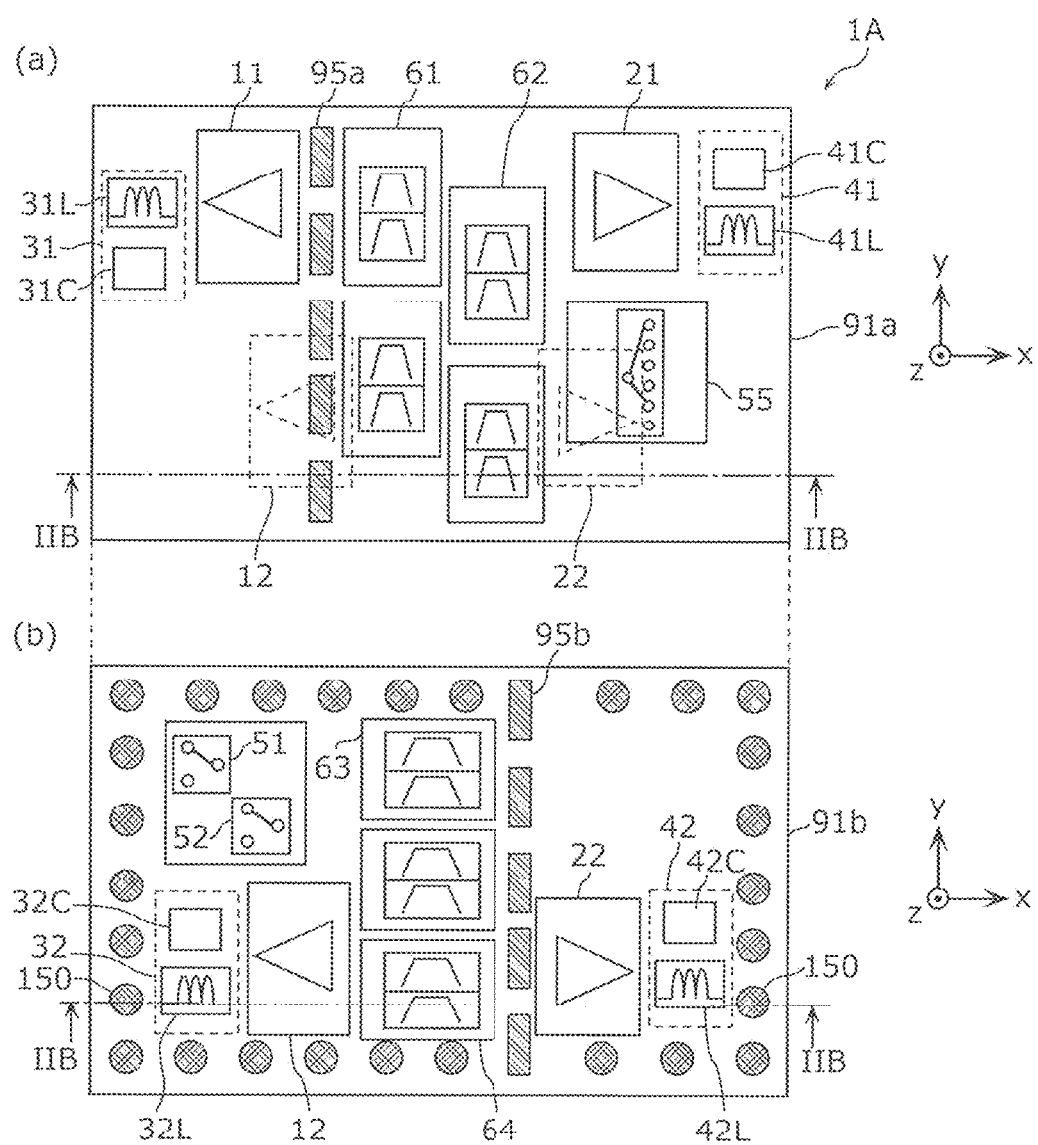
FIG. 2A is a schematic diagram illustrating a plan view configuration of a radio frequency module according to a working example.

FIG. 2A is a schematic diagram illustrating a plan view configuration of radio frequency module 1A according to a working example. Furthermore, FIG. 26 is a schematic diagram illustrating a cross-sectional configuration of radio frequency module 1A according to a working example, and specifically illustrates a cross-section taken along line IIB-IIB in FIG. 2A. It should be noted that (a) in FIG. 2A illustrates an arrangement diagram of circuit elements in the case where principal surface 91a of opposite principal surfaces 91a and 91b of module board 91 is viewed from the z-axis positive direction-side. On the other hand, (b) in FIG. 2A illustrates a see-through view of the arrangement of circuit elements in the case where principal surface 91b is viewed from the z-axis positive direction-side.

As illustrated in FIG. 2A and FIG. 26, radio frequency module 1A according to the working example further includes module board 91, resin members 92 and 93, and metal chips 95a and 95b, in addition to the circuit configuration illustrated in FIG. 1.

Module board 91 has principal surface 91a (first principal surface) and principal surface 91b (second principal surface) on opposite sides, and is a board on which low-noise amplifiers 21 and 22 are mounted. For module board 91, for example, a low temperature co-fired ceramic (LTCC) board having a stacked structure of a plurality of dielectric layers, a printed circuit board, or the like can be used.

As illustrated in FIGS. 2A and 26, in radio frequency module 1A according to this working example, transmission power amplifier 11, reception low-noise amplifier 21, duplexers 61 and 62, matching circuits 31 and 41, switch 55, and metal chips 95a are surface-mounted on principal surface 91a of module board 91. On the other hand, transmission power amplifier 12, reception low-noise amplifier 22, duplexers 63 and 64, matching circuits 32 and 42, switches 51 and 52, and metal chips 95b are surface-mounted on principal surface 91b of module board 91. It should be noted that, although not illustrated in FIGS. 2A and 2B, switches 53, 54, and 56, matching circuits 71 to 74, and coupler 80 may be surface-mounted on either of principal surfaces 91a and 91b of module board 91 or may be embedded in module board 91.

That is, in radio frequency module 1A according to this working example, principal surface 91a has mounted thereon the first transmission circuit including transmission path AT for communication band A and transmission path BT for communication band B, and the first reception circuit including reception path AR for communication band A and reception path BR for communication band B. On the other hand, principal surface 91b has mounted thereon the second transmission circuit including transmission path CT for communication band C and transmission path DT for communication band D, and the second reception circuit including reception path CR for communication band C and reception path DR for communication band D.

Resin member 92 is disposed on principal surface 91a of module board 91 and covers the first transmission circuit, the first reception circuit, and principal surface 91a of module board 91. Resin member 92 has a function of ensuring the reliability, such as the mechanical strength and the moisture resistance, of the circuit elements in the first transmission circuit and the first reception circuit. It should be noted that resin member 92 is not an essential element of the radio frequency module according to the present disclosure.

Resin member 93 is disposed on principal surface 91*b* of module board 91 and covers the second transmission circuit, the second reception circuit, and principal surface 91*b* of module board 91. Resin member 93 has a function of ensuring the reliability, such as the mechanical strength and the moisture resistance, of the circuit elements in the second transmission circuit and the second reception circuit. It should be noted that resin member 93 is not an essential element of the radio frequency module according to the present disclosure.

In radio frequency module 1A according to this working example, columnar electrodes 150 are disposed on principal surface 91*b*-side of module board 91. Radio frequency module 1A exchanges, via columnar electrodes 150, electric signals with a mounting board disposed on the z-axis negative direction-side of radio frequency module 1A. Some of columnar electrodes 150 are set to the ground potential of the mounting board.

In radio frequency module 1A according to this working example, transmission power amplifier 11 that amplifies radio frequency transmission signals of the first frequency band group are mounted on principal surface 91*a*, while transmission power amplifier 12 that amplifies radio frequency transmission signals of the second frequency band group be mounted on principal surface 91*b*. In other words, transmission power amplifier 11 that amplifies radio frequency transmission signals of the first frequency band group and transmission power amplifier 12 that amplifies radio frequency transmission signals of the second frequency band group are mounted with module board 91 interposed therebetween.

This can prevent harmonic components of a radio frequency transmission signal amplified by one of transmission power amplifiers 11 and 12, or intermodulation distortion components of two radio frequency transmission signals amplified by transmission power amplifiers 11 and 12, from being superimposed on the radio frequency transmission signal amplified by the other one of transmission power amplifiers 11 and 12. It is therefore possible to avoid the deterioration of the signal quality of the radio frequency transmission signals amplified by transmission power amplifiers 11 and 12 and output from frequency module 1A. Also, the harmonic components and the intermodulation distortion components can be prevented from flowing into the reception circuits and deteriorating the reception sensitivity.

As illustrated in (a) in FIG. 2A, in a plan view of module board 91, transmission power amplifier 11 and transmission power amplifier 12 desirably do not overlap.

This can ensure a longer distance between transmission power amplifier 11 and transmission power amplifier 12 than in the case of overlapping transmission power amplifier 11 and transmission power amplifier 12 in the plan view. Consequently, the harmonic components and the intermodulation distortion components can further be prevented from being superimposed on the radio frequency transmission signal amplified by the other one of transmission power amplifiers 11 and 12. Also, the harmonic components and the intermodulation distortion components can further be prevented from flowing into the reception circuits and deteriorating the reception sensitivity.

It is desirable that matching circuits 31 and 41 be mounted on principal surface 91*a* of module board 91. Matching circuits 32 and 42 are desirably mounted on principal surface 91*b* of module board 91.

Matching circuit 31 includes inductor 31L and capacitor 31C. Matching circuit 32 includes inductor 32L and capacitor 32C. Matching circuit 41 includes inductor 41L and capacitor 41C. Matching circuit 42 includes inductor 42L and capacitor 42C.

Inductor 31L is a first inductance element included in transmission output matching circuit 30. For example, inductor 31L is implemented as a chip inductor or as a wiring pattern formed on principal surface 91*a*. Inductor 32L is a second inductance element included in transmission output matching circuit 30. For example, inductor 32L is implemented as a chip inductor or as a wiring pattern formed on principal surface 91*b*.

Inductor 41L is a third inductance element included in reception input matching circuit 40 and mounted on principal surface 91*a*. For example, inductor 41L is implemented as a chip inductor or as a wiring pattern formed on principal surface 91*a*. Inductor 42L is a fourth inductance element included in reception input matching circuit 40 and mounted on principal surface 91*b*. For example, inductor 42L is implemented as a chip inductor or as a wiring pattern formed on principal surface 91*b*.

The above configuration can prevent electromagnetic field coupling between inductor 311 and inductor 321 because inductor 311 and inductor 321 are mounted with module board 91 interposed therebetween, Consequently, mutual interference between transmission path AT and transmission path CT can be reduced to improve the isolation between transmission path AT and transmission path CT.

As illustrated in FIG. 2A, it is desirable that duplexers 61 and 62 be mounted on principal surface 91*a* of module board 91 while duplexers 63 and 64 be mounted on principal surface 91*b* of module board 91, That is, reception filters 61R and 62R are mounted on principal surface 91*a* of module board 91, and reception filters 63R and 64R are mounted on principal surface 91*b* of module board 91, Transmission filters 61T and 62T are mounted on principal surface 91*a* of module board 91, and transmission filters 63T and 64T are mounted on principal surface 91*b* of module board 91.

The above configuration can ensure a long distance between transmission path AT in which transmission filter 61T is disposed and transmission path CT in which transmission filter 63T is disposed, because transmission filter 61T and transmission filter 631 are mounted with module board 91 interposed therebetween. Consequently, mutual interference between transmission path AT and transmission path CT can be further reduced to further improve the isolation between transmission path AT and transmission path CT.

Furthermore, in radio frequency module 1A according to this working example, reception low-noise amplifier 21 that amplifies radio frequency reception signals of the first frequency band group is mounted on principal surface 91*a*, whereas reception low-noise amplifier 22 that amplifies radio frequency reception signals of the second frequency band group may be mounted on principal surface 91*b*. In other words, reception low-noise amplifier 21 that amplifies radio frequency reception signals of the first frequency band group and reception low-noise amplifier 22 that amplifies radio frequency reception signals of the second frequency band group may be mounted with module board 91 interposed therebetween.

This can prevent, for example, a radio frequency reception signal of communication band C propagated through reception path CR from being superimposed on a radio frequency reception signal of communication band A propagated through reception path AR, and therefore can reduce mutual interference between reception path AR and reception path CR to improve the isolation. Consequently, deterioration of the reception sensitivity of reception path AR can be prevented. Similarly, deterioration of the reception sensitivity of other reception paths BR, CR, and DR can be prevented.

As illustrated in (a) in FIG. 2A, in a plan view of module board 91, reception low-noise amplifier 21 and reception low-noise amplifier 22 need not overlap.

This can ensure a longer distance between reception low-noise amplifier 21 and reception low-noise amplifier 22 than in the case of overlapping reception low-noise amplifier 21 and reception low-noise amplifier 22 in the plan view. Consequently, mutual interference between reception path AR and reception path CR can be further reduced to further improve the isolation.

Furthermore, in radio frequency module 1A according to this working example, the above configuration can prevent electromagnetic field coupling between inductor 41L and inductor 42L because inductor 41L and inductor 42L are mounted with module board 91 interposed therebetween. Consequently, mutual interference between reception path AR and reception path CR can be further reduced to further improve the isolation.

Furthermore, in radio frequency module 1A according to this working example, the above configuration can ensure a long distance between reception path AR in which reception filter 61R is disposed and reception path CR in which reception filter 63R is disposed, because reception filter 61R and reception filter 63R are mounted with module board 91 interposed therebetween, Consequently, mutual interference between reception path AR and reception path CR can be further reduced to further improve the isolation.

Figure 2B:
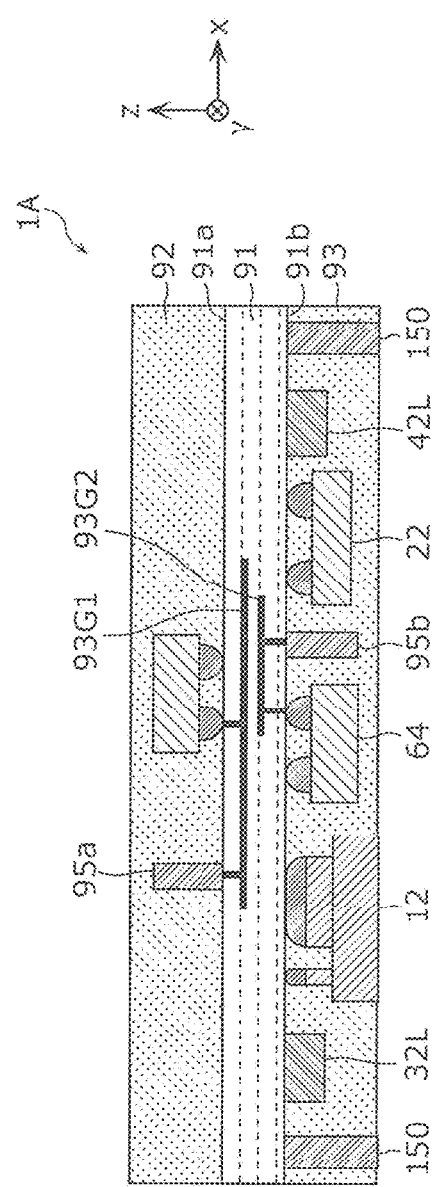
FIG. 2B is a schematic diagram illustrating a cross-sectional configuration of the radio frequency module according to a working example.

In radio frequency module 1A according to this working example, in a plan view of module board 91 (viewed from the z-axis direction), a conductive member mounted on principal surface 91a is disposed with module board 91 interposed therebetween. The conductive member here is an electronic member having a conductive member such as a signal extraction electrode, and is, for example, at least any one of passive elements such as a resistor element, a capacitive element, an inductive element, a filter, a switch, a signal wire, and a signal terminal, and active elements such as an amplifier and a control circuit. In this embodiment, the conductive member is at least any one of duplexers 61 to 64. Further, the conductive member may be at least any one of the transmission filters and the reception filters in respective duplexers 61 to 64, The transmission filters and the reception filters in respective duplexers 61 to 64 have conductive members such as signal extraction electrodes. For example, at least one of the signal extraction electrodes is connected to ground pattern 93G1 or 93G2 disposed in module board 91, as illustrated in FIG. 2B.

According to the above configuration, while matching circuits 31 and 41 are disposed on principal surface 91a of module board 91, at least one of duplexers 61 to 64 mounted on principal surface 91a is disposed between inductor 31L and inductor 41L. While matching circuits 32 and 42 are disposed on principal surface 91b of module board 91, at least one of duplexers 61 to 64 mounted on principal surface 91b is disposed between inductor 32L and inductor 42L. At least one of duplexers 61 to 64 can therefore block electromagnetic fields generated by inductors 31L and 32L and inductors 41L and 42L to prevent electromagnetic field coupling between (i) inductors 31L and 32L and (ii) inductors 41L and 42L. This can reduce harmonic components of a high-power radio frequency transmission signal amplified by transmission power amplifiers 11 and 12, or intermodulation distortion components of this radio frequency transmission signal and another radio frequency signal, flowing into the reception circuits. Deterioration of the reception sensitivity of radio frequency module 1A can therefore be prevented.

It should be noted that "a conductive member mounted on principal surface 91a is disposed between inductor 31L and inductor 41L in a plan view of module board 91" holds if at least part of the region of the conductive member projected on the plan view overlaps a line connecting any point in the region of inductor 31L projected on the plan view and any point in the region of inductor 41L projected on the plan view. It should also be noted that "a conductive member mounted on principal surface 91b is disposed between inductor 32L and inductor 42L in a plan view of module board 91" holds if at least part of the region of the conductive member projected on the plan view overlaps a line connecting any point in the region of inductor 32L projected on the plan view and any point in the region of inductor 42L projected on the plan view. It is thus possible to reduce harmonic components of a high-power radio frequency transmission signal transferred through a transmission path, or intermodulation distortion components of this radio frequency transmission signal and another radio frequency signal, flowing into a reception path. Deterioration of the reception sensitivity in the reception path can therefore be prevented, Consequently, deterioration of the reception sensitivity of radio frequency module 1A can be prevented.

In radio frequency module 1A according to this working example, in a plan view of module board 91 (viewed from the z-axis direction), metal chips 95a mounted on principal surface 91a are disposed between inductor 31L and inductor 41L, and metal chips 95b mounted on principal surface 91b are disposed between inductor 321_ and inductor 42L.

As illustrated in FIG. 2B, each of metal chips 95a is connected to ground pattern 93G1 disposed in module board 91, and each of metal chips 95b is connected to ground pattern 93G2 disposed in module board 91.

According to the above configuration, metal chips 95a can block electromagnetic fields generated by inductor 31L and inductor 41L, and metal chips 95b can block electromagnetic fields generated by inductor 32L and inductor 42L. Therefore, electromagnetic field coupling between inductor 31L and inductor 41L and electromagnetic field coupling between inductor 32L and inductor 42L can be prevented. This can reduce harmonic components of a high-power radio frequency transmission signal amplified by transmission power amplifiers 11 and 12, or intermodulation distortion components of this radio frequency transmission signal and another radio frequency signal, flowing into the reception circuits. Deterioration of the reception sensitivity of radio frequency module 1A can therefore be prevented.

It should be noted that, although duplexers 61 and 62 are disposed between inductor 31L and inductor 41L in addition to metal chips 95a mounted on principal surface 91a in this working example, duplexers 61 and 62 may not be disposed between inductor 31L and inductor 41L in this working example. It should also be noted that, although duplexers 63 and 64 are disposed between inductor 32L and inductor 42L in addition to metal chips 95b mounted on principal surface 91b, duplexers 63 and 64 may not be disposed between inductor 32L and inductor 42L in this working example. This is because metal chips 95a have the function of blocking electromagnetic fields generated by inductors 31L and 41L, and metal chips 95b have the function of blocking electromagnetic fields generated by inductors 32L and 42L.

This working example has illustrated the duplexers and the metal chips as conductive members disposed between (i) inductors 31L and 32L and (ii) inductors 41L and 42L. The conductive members may also be any of (1) a chip capacitor, (2) switch 55, (3) switch 51 or 52, (4) switch 53 or 54, (5) a diplexer (multiplexer) disposed between (i) common terminal 100 and (ii) the transmission filters and the reception filters, and (6) a control circuit that generates at least one of a control signal for adjusting the gains of transmission power amplifiers 11 and 12 and reception low-noise amplifiers 21 and 22, and a control signal for controlling the switching of switches 51 to 56.

The control circuit in above (6) may be a switch IC that includes at least one of switches 51 to 56.

The circuit elements in above (1) to (6) desirably have an electrode set to a ground potential or a fixed potential. For example, the circuit elements in above (1) to (6) are desirably connected to a ground pattern formed in module board 91. This improves the electromagnetic field blocking function of the circuit elements in above (1) to (6).

With the conductive members illustrated above, electromagnetic fields generated by inductors 31L and 32L and inductors 41L and 42L can be blocked to prevent electromagnetic field coupling between (i) inductors 31L and 32L and (ii) inductors 41L and 42L. This can reduce harmonic components of a high-power radio frequency transmission signal amplified by transmission power amplifier 11 and 12, or intermodulation distortion components of this radio frequency transmission signal and another radio frequency signal, flowing into the reception circuits. Deterioration of the reception sensitivity of the radio frequency module can therefore be prevented.

The radio frequency module according to this embodiment has the conductive members mounted on module board 91 between (i) inductors 31L and 32L and (ii) inductors 41L and 42L. Alternatively, the following configuration may be adopted.

Figure 3:
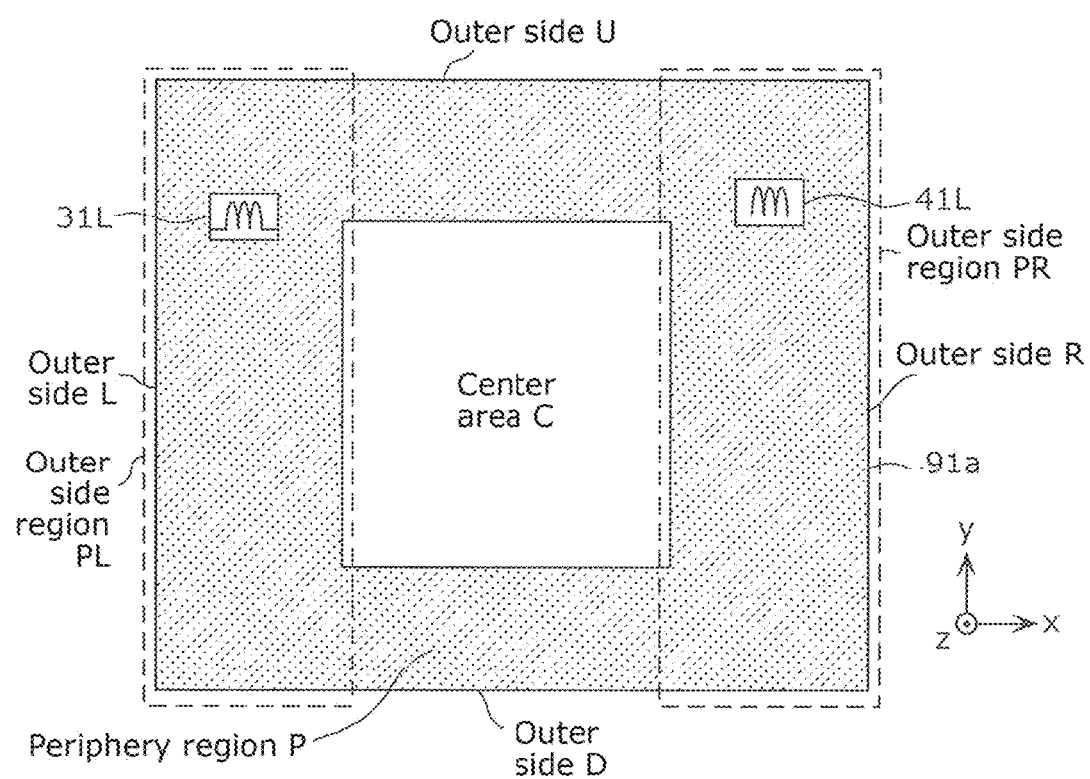
FIG. 3 is a diagram for describing a spaced arrangement of a first inductance element and a third inductance element according to a working example.

FIG. 3 is a diagram for describing a spaced arrangement of inductors 31L and 41L according to a working example. This figure shows only inductor 31L of matching circuit 31 and inductor 41L of matching circuit 41, among transmission power amplifier 11, reception low-noise amplifier 21, duplexers 61 and 62, matching circuits 31 and 41, and switch 55 mounted on principal surface 91a of module board 91.

In a plan view of principal surface 91a, principal surface 91a is rectangular and has a center region C that includes at least one of transmission filters 61T and 62T and reception filters 61R and 62R, and a periphery region P that excludes the center region C. The periphery region P further has four outer side regions PU (not illustrated in FIG. 3), PD (not illustrated in FIG. 3), PL, and PR that include four outer sides U, D, L, and R, respectively, of principal surface 91a. Here, in a plan view of principal surface 91a, inductor 31L and inductor 41L are disposed in two opposing outer side regions PL and PR, respectively, with center region C interposed therebetween, or in two opposing outer side regions PU and PD, respectively, with center region C interposed therebetween. Inductor 32L and inductor 42L mounted on principal surface 91b are also in an arrangement relationship similar to that of inductor 31L and inductor 41L.

According to the above configuration, inductor 31L and inductor 41L are distributed on principal surface 91a of module board 91 in opposing outer side regions, between which center region C including at least any one of the transmission filters and the reception filters is interposed. Inductor 31L and inductor 41L disposed on principal surface 91a of module board 91 are thus spaced apart from each other, so that it is possible to reduce the extent to which an electromagnetic field generated by inductor 31L reaches inductor 41L. Inductor 32L and inductor 42L are also distributed on principal surface 91b of module board 91 in opposing outer side regions, between which center region C including at least any one of the transmission filters and the reception filters is interposed, Inductor 32L and inductor 42L disposed on principal surface 91b of module board 91 are thus spaced apart from each other, so that it is possible to reduce the extent to which an electromagnetic field generated by inductor 32L reaches inductor 42L.

This can reduce harmonic components of a high-power radio frequency transmission signal amplified by transmission power amplifier 11 and 12, or intermodulation distortion components of this radio frequency transmission signal and another radio frequency signal, flowing into the reception circuits. Deterioration of the reception sensitivity of radio frequency module 1A can therefore be prevented.

OTHER EMBODIMENTS

Although radio frequency modules and communication devices according to the present disclosure have been described above based on an exemplary embodiment and working examples thereof, the radio frequency circuit and communication device according to the present disclosure are not limited to the foregoing embodiment and working examples. The present disclosure also encompasses other embodiments achieved by combining arbitrary elements in the above embodiment and working examples thereof, variations resulting from various modifications to the embodiment and working examples thereof that may be conceived by those skilled in the art without departing from the essence of the present disclosure, and various devices that include the radio frequency module and communication device according to the present disclosure.

For example, in the radio frequency modifies and communication devices according to the foregoing exemplary embodiment and working examples thereof, another circuit element and line may be inserted in a path connecting respective circuit elements and signal paths disclosed in the drawings.

INDUSTRIAL APPLICABILITY

The present disclosure can be widely used in communication apparatuses such as a mobile phone, as a radio frequency module provided in a multiband-compatible front-end unit.

The invention claimed is:
1. A radio frequency module, comprising:
a first transmission power amplifier configured to amplify and output a radio frequency signal of a first communication band;
a second transmission power amplifier configured to amplify and output a radio frequency signal of a second communication band; and
a module board which includes a first principal surface and a second principal surface on opposite sides of the module board, wherein the first transmission power amplifier and the second transmission power amplifier are capable of outputting simultaneously, the first transmission power amplifier is disposed on the first principal surface, and the second transmission power amplifier is disposed on the second principal surface.

2. The radio frequency module according to claim 1, wherein in a plan view of the module board, the first transmission power amplifier and the second transmission power amplifier do not overlap.

3. A communication device, comprising:

an RF signal processing circuit configured to process a radio frequency signal which is transmitted or received by an antenna element; and the radio frequency module according to claim 1 configured to propagate the radio frequency signal between the antenna element and the RF signal processing circuit.

4. The radio frequency module according to claim 1, further comprising:

a switch including a first terminal connected to an antenna element, a second terminal connected to a first transmission path including the first transmission power amplifier, and a third terminal connected to a second transmission path including the second transmission power amplifier, the switch being capable of simultaneously establishing connection between the first terminal and the second terminal and connection between the first terminal and the third terminal.

5. A radio frequency module, comprising:

a first transmission power amplifier configured to amplify a radio frequency signal of a first communication band;

a second transmission power amplifier configured to amplify a radio frequency signal of a second communication band; and a first transmission output matching circuit connected to an output terminal of the first transmission power amplifier;

a second transmission output matching circuit connected to an output terminal of the second transmission power amplifier, and a module board which includes a first principal surface and a second principal surface on opposite sides of the module board, wherein the first transmission output matching circuit includes a first inductance element mounted on the first principal surface, the second transmission output matching circuit includes a second inductance element mounted on the second principal surface, the first transmission power amplifier is disposed on the first principal surface, and the second transmission power amplifier is disposed on the second principal surface.

6. The radio frequency module according to claim 5, wherein the first transmission power amplifier and the second transmission power amplifier are capable of outputting simultaneously.

7. The radio frequency module according to claim 5, further comprising:

a switch including a first terminal connected to an antenna element, a second terminal connected to a first transmission path including the first transmission power amplifier, and a third terminal connected to a second transmission path including the second transmission power amplifier, the switch being capable of simultaneously establishing connection between the first terminal and the second terminal and connection between the first terminal and the third terminal.

8. A radio frequency module, comprising:

a module board which includes a first principal surface and a second principal surface on opposite sides of the module board;

a first transmission power amplifier mounted on the first principal surface and configured to amplify a radio frequency signal of a first communication band;

a second transmission power amplifier mounted on the second principal surface and configured to amplify a radio frequency signal of a second communication band;

a first transmission filter disposed in a first transmission path including the first transmission power amplifier, the first transmission filter being mounted on the first principal surface; and a second transmission filter disposed in a second transmission path including the second transmission power amplifier, the second transmission filter being mounted on the second principal surface.

9. The radio frequency module according to claim 8, wherein the first transmission power amplifier and the second transmission power amplifier are capable of outputting simultaneously.

10. The radio frequency module according to claim 8, further comprising:

a switch including a first terminal connected to an antenna element, a second terminal connected to the first transmission path including the first transmission power amplifier, and a third terminal connected to the second transmission path including the second transmission power amplifier, the switch being capable of simultaneously establishing connection between the first terminal and the second terminal and connection between the first terminal and the third terminal.

* * * * *